United States Patent
Yang et al.

(10) Patent No.: US 8,050,057 B2
(45) Date of Patent: Nov. 1, 2011

(54) MOUNTING STRUCTURE FOR AN ELECTRONIC ELEMENT

(75) Inventors: Shih-Jen Yang, Taipei County (TW); Hung-Sen Tu, Taipei County (TW)

(73) Assignee: System General Corporation, Sindian, Taipei County (TW)

( * ) Notice: Subject to any disclaimer, the term of this patent is extended or adjusted under 35 U.S.C. 154(b) by 366 days.

(21) Appl. No.: 12/501,506

(22) Filed: Jul. 13, 2009

(65) Prior Publication Data

US 2010/0309645 A1    Dec. 9, 2010

Related U.S. Application Data

(60) Provisional application No. 61/217,791, filed on Jun. 3, 2009.

(51) Int. Cl.
*H05K 7/20*    (2006.01)

(52) U.S. Cl. ......... 361/825; 361/695; 165/80.3; 385/53; 455/344

(58) Field of Classification Search .................. 710/301, 710/310, 315, 52, 300, 104, 63; 361/695, 361/741, 761, 785, 818; 385/53, 89, 92, 385/135, 88; 455/552.1, 573, 557, 550.1, 455/90.3, 73, 344, 575.9; 165/80.3; 349/58
See application file for complete search history.

(56) References Cited

U.S. PATENT DOCUMENTS

| | | | |
|---|---|---|---|
| 2002/0150344 A1* | 10/2002 | Chiu et al. | 385/53 |
| 2005/0199370 A1* | 9/2005 | Huang | 165/80.3 |
| 2007/0097635 A1* | 5/2007 | Chang | 361/695 |

* cited by examiner

*Primary Examiner* — Hung Duong
(74) *Attorney, Agent, or Firm* — Thomas|Kayden

(57) ABSTRACT

A mounting structure for fixing an electronic element on a heat dissipation unit is provided. The mounting structure includes a heat dissipation unit, a fixing member, electronic elements and elastic elements. The fixing member is fixed on the heat dissipation unit. The elastic elements are sandwiched between the electronic elements and the fixing member, wherein the fixing member and the elastic elements press the electronic elements to make the electronic elements tightly contact the heat dissipation unit.

9 Claims, 5 Drawing Sheets

MOUNTING STRUCTURE FOR AN ELECTRONIC ELEMENT

CROSS REFERENCE TO RELATED APPLICATIONS

This application claims the benefit of U.S. Provisional Application No. 61/217,791, filed Jun. 3, 2009, the entirety of which is incorporated by reference herein.

BACKGROUND OF THE INVENTION

1. Field of the Invention

The present invention relates to a mounting structure, and in particular relates to a mounting structure for fixing an electronic element to a heat dissipation unit.

2. Description of the Related Art

FIG. 1 shows a conventional semiconductor element mount structure 1, which comprises a semiconductor element 10. The semiconductor element 10 comprises a body 11, a die 12 and a plurality of leads 13. The die 12 is embedded in the body 11. The leads 13 extend out from the body 11, and are electrically connected to a printed circuit board (not shown). The semiconductor element 10 is fixed on a mounting surface 21 of the heat dissipating unit 20 by a screw 30. The heat dissipating unit 20 comprises a heat sink 23 and an interface material 22. The heat sink (fins) 23 is made of a high heat conductive material, such as copper or aluminum. The interface material 22, such as a heat conductive grease material or a heat conductive sheet material, is sandwiched between the semiconductor element 10 and the heat sink 23.

Conventionally, the semiconductor element 10 is fixed on the heat dissipating unit 20 by the screw 30. The heat dissipation performance of the heat dissipation unit therefore is influenced by the material of the heat dissipating unit 20, the flatness of the mounting surface 21 of the heat dissipating unit 20, the screw torque of the screw 30 or the like. IGBT chip is operated under high temperature and low temperature rapidly, the plastic insulant of the IGBT chip is often deteriorated and embrittled thereby, and the IGBT chip cannot sufficiently contact the heat dissipating unit. The heat dissipation efficiency of the IGBT chips reduced, and the IGBT chips reduced is easily damaged. As well, the IGBT chips reduced is fixed by bolt passing therethrough, assembly error may cause short circuit under high voltage environment. Thus, it is difficult to achieve stable heat dissipation performance.

FIG. 2 shows another conventional semiconductor element mount structure 2. A plurality of semiconductor elements 10 are pressed against a heat dissipating unit 20 by a metal strip 30. The metal strip 30 is fixed on the heat dissipating unit 20 by a bolt 31, and the semiconductor elements 10 are sandwiched between the metal strip 30 and the heat dissipating unit 20. However, since the height of each semiconductor element 10 differs from each other, the metal strip 30 cannot sufficiently press all of the semiconductor elements 10, thereby resulting in inefficient heat dissipating performance.

BRIEF SUMMARY OF THE INVENTION

A detailed description is given in the following embodiments with reference to the accompanying drawings.

A mounting structure for fixing an electronic element on a heat dissipation unit is provided. The mounting structure includes a fixing member and at least one elastic element. The fixing member is fixed on the heat dissipation unit. The elastic element is sandwiched between the electronic element and the fixing member, wherein the fixing member and the elastic element press the electronic element to make the electronic element tightly contact the heat dissipation unit.

Additionally, a mounting structure of an embodiment of the invention is provided. The mounting structure includes a heat dissipation unit, a fixing member, electronic elements and elastic elements. The fixing member is fixed on the heat dissipation unit. The elastic elements are sandwiched between the electronic elements and the fixing member, wherein the fixing member and the elastic elements press the electronic elements to make the electronic elements tightly contact the heat dissipation unit.

According to the embodiment of the invention, the electronic elements of different heights are pressed to tightly contact the heat dissipation unit, thereby resulting in efficient heat dissipating performance.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
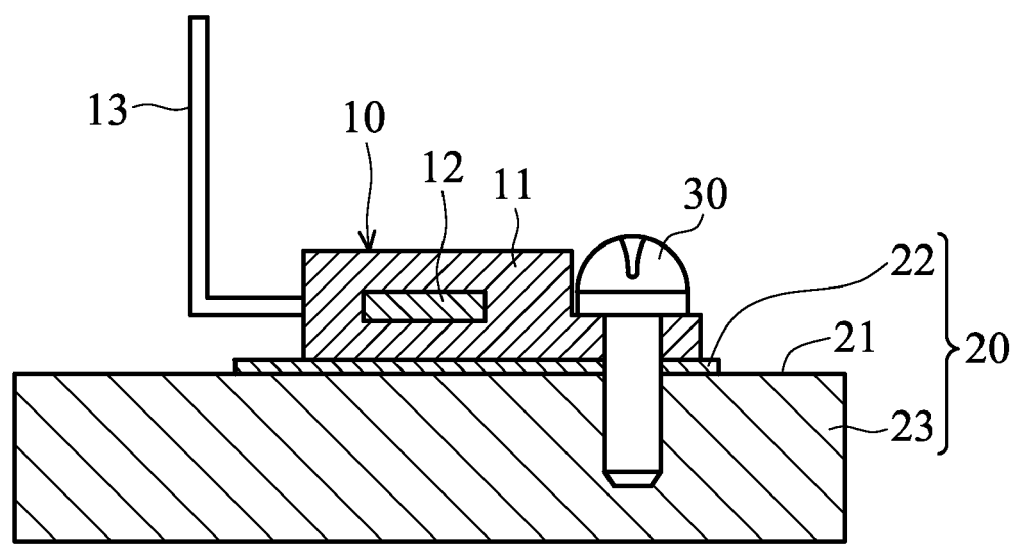
FIG. 1 shows a conventional semiconductor element mount structure.
Figure 2:
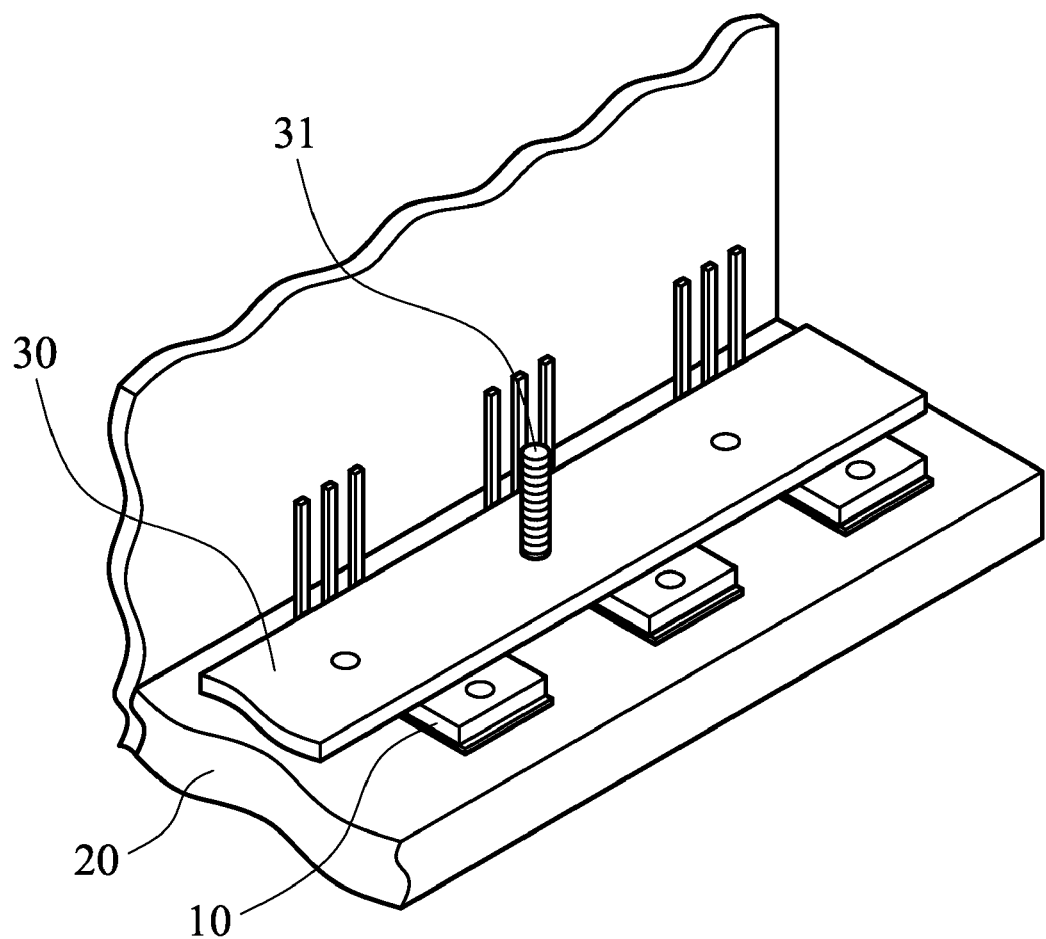
FIG. 2 shows another conventional semiconductor element mount structure.
Figure 3:
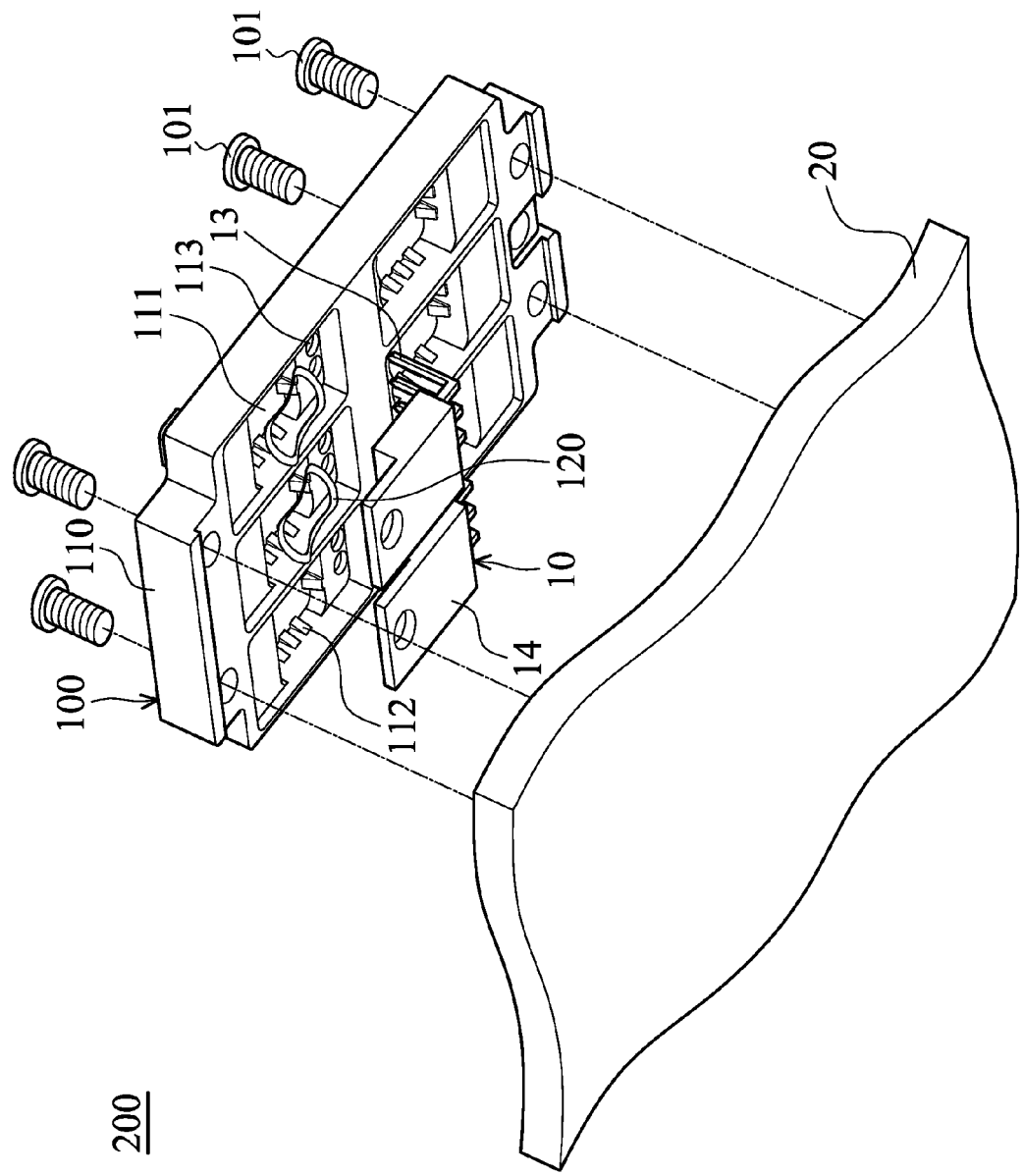
FIG. 3 is an exploded view of a mounting structure of an embodiment of the invention.
Figure 4:
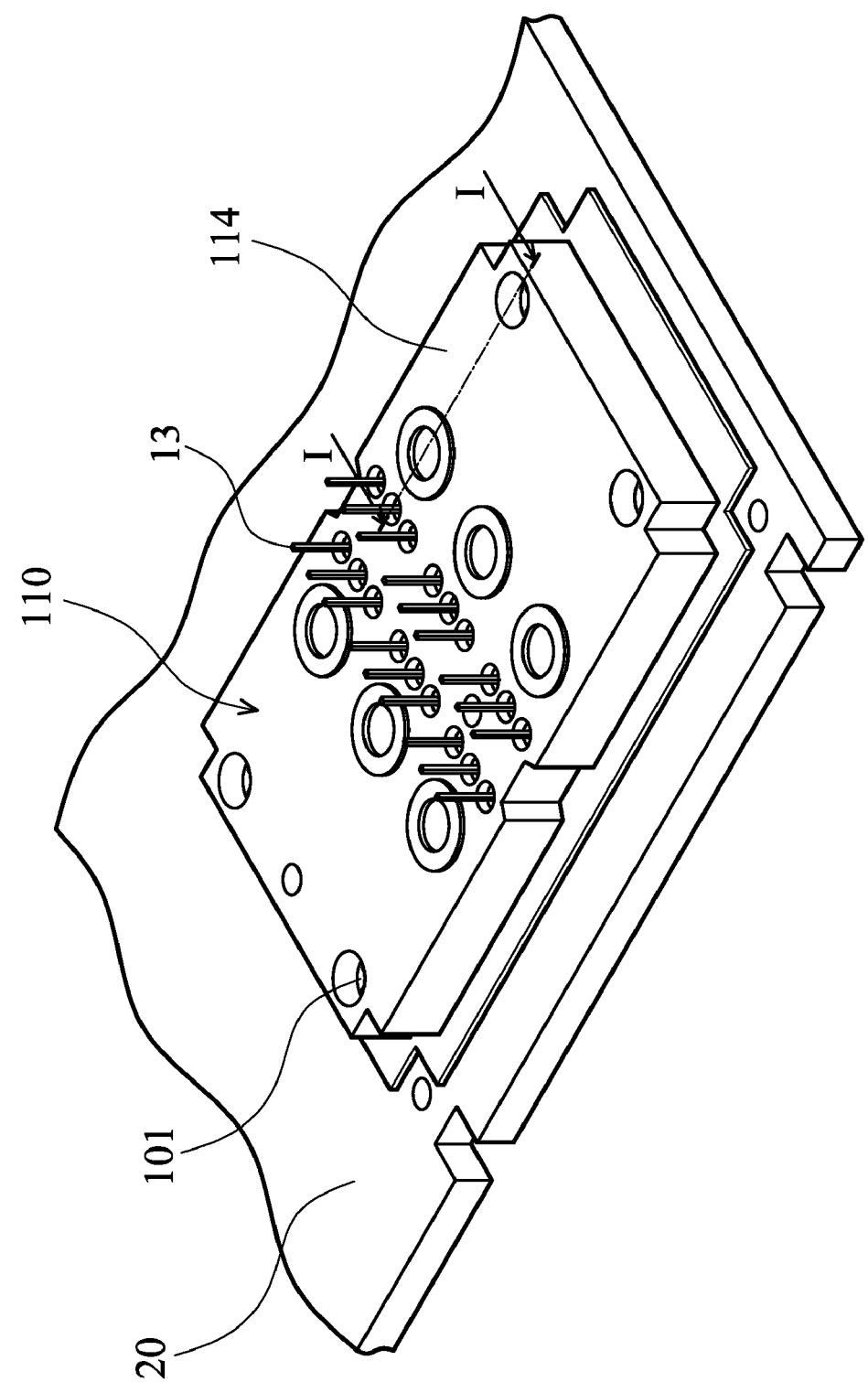
FIG. 4 is an assembled view of the mounting structure of the embodiment of the invention.

FIGS. 3 and 4 show a mounting structure 100 of an embodiment of the invention, which is for fixing electronic elements 10 to a heat dissipation unit 20. FIG. 3 is an exploded view of the mounting structure 100 of the embodiment, and FIG. 4 is an assembled view of the mounting structure 100 of the embodiment. The electronic elements 10 are semiconductor elements, such as IGBT chips.

With reference to FIGS. 3 and 4, the mounting structure 100 comprises a heat dissipation unit 20, a fixing member 110, elastic elements 120, and electronic elements 10. The fixing member 110 is fixed on the heat dissipation unit 20. The elastic elements 120, which can be a wave spring or the like, are sandwiched between the electronic element 10 and the fixing member 110. The fixing member 110 and the elastic elements 120 press the electronic elements 10 to make the electronic elements 10 tightly contact the heat dissipation unit 20. The fixing member 110 is made of insulation material.

Figure 5:
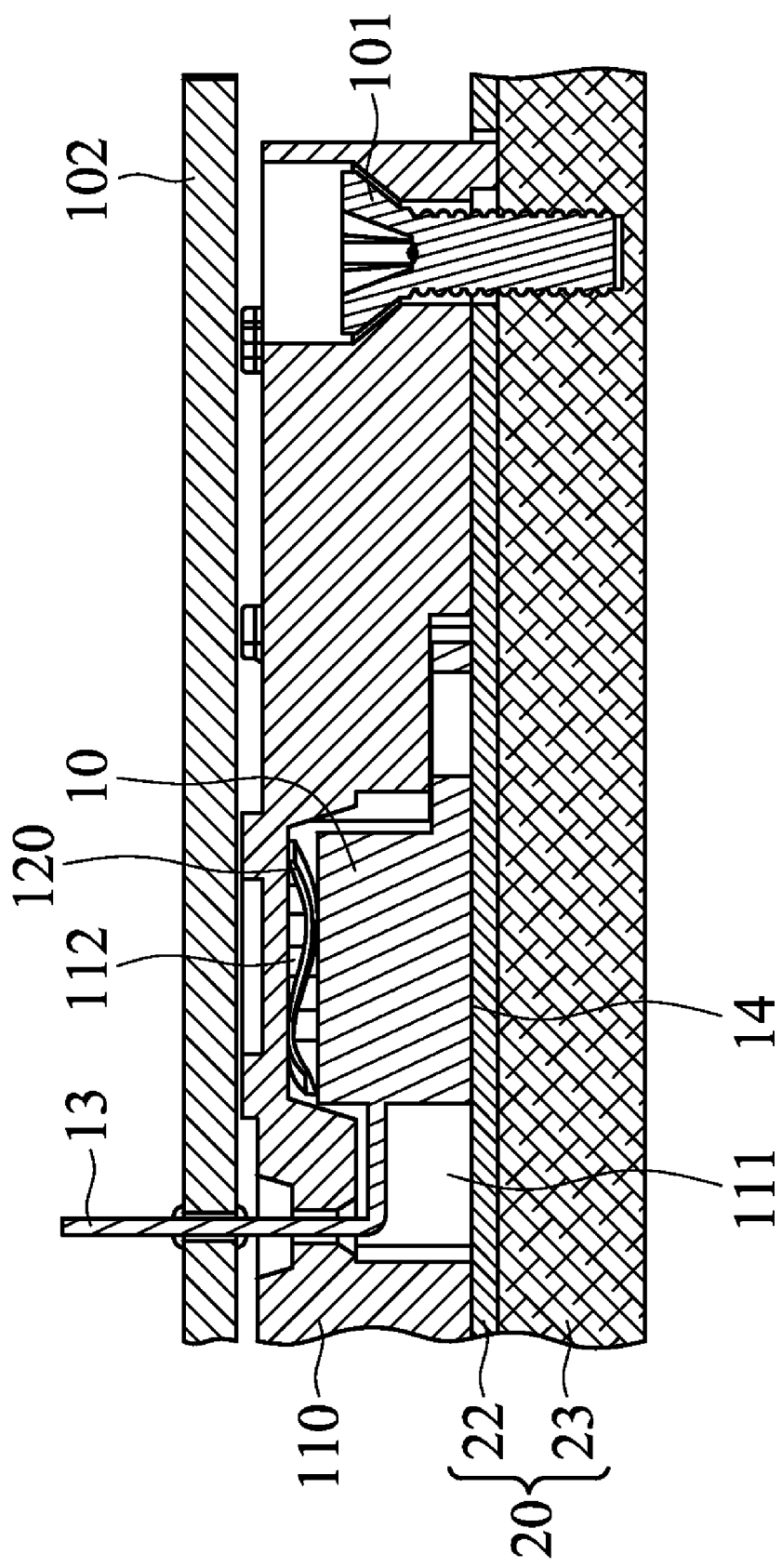
FIG. 5 is a sectional view along I-I direction of FIG. 4.

FIG. 5 is a sectional view along I-I direction of FIG. 4. With reference to FIG. 5, the electronic element 10 contacts the heat dissipation unit 20 with a contact surface 14. The heat dissipation unit 20 comprises a heat sink 23 and an interface material 22. The heat sink (fins) 23 is made of a high heat conductive material, such as copper or aluminum. The interface material 22, such as a heat conductive grease material or a heat conductive sheet material, is sandwiched between the electronic element 10 and the heat sink 23.

The fixing member 110 is fixed on the heat dissipation unit 20 via fixers 101. The fixers 101 are bolts.

With reference to FIGS. 3, 4 and 5, the fixing member 110, which is made of insulation material, comprises a plurality of receiving portions 111 arranged in a matrix form. Each of the electronic elements 10 is disposed in the corresponding receiving portions 111 respectively, and the elastic element 120 is sandwiched between the electronic element 10 and the fixing member 110. The fixing member 110 with the electronic elements 10 and the elastic elements 120 disposed therein is then fixed on the heat dissipation unit 20 via fixers 101.

The receiving portions 111 limit degree of freedom of the electronic elements 10. Each receiving portion 111 has a recess, having a plurality of positioning protrusions 112 and a plurality of through holes 113. The positioning protrusions 112 are triangular, formed on an inner wall of the receiving portion 111, and the positioning protrusions 112 surround the electronic element 10 to limit degree of freedom thereof. The electronic element 10 has a plurality of leads 13, wherein the leads 13 extend from the receiving portion 111, pass through the through holes 113, and protrude on a surface 114 of the fixing member 110. The leads 13 are electrically connected to a print circuit board 102 (FIG. 5).

The elastic elements 120 are wave springs in the embodiment. The elastic elements 120 abut the electronic elements 10 and the inner wall of the receiving portions 111. The elastic elements 120 apply multiple elastic forces on circular area of the electronic elements 10 to ensure each of the electronic elements 10 tightly contact the heat dissipation unit 20. Thus, heat dissipation performance of the heat dissipation unit is improved. Specifically, the electronic elements of different heights are pressed to tightly contact the heat dissipation unit. Accordingly, heat dissipation performance of the heat dissipation unit is improved when compared to prior art, and the life period of the electronic elements 10 can be increased. The electronic elements 10 are disposed on the print circuit board 102 by fixing a fixing member 110 with a plurality receiving portions 111 formed in advance, the relative positioning of these parts becomes much easier, and the assembling steps can be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An mounting structure for an electronic element, comprising:
    a heat dissipation unit comprising a mounting surface;
    a fixing member, comprising at least one receiving portion facing the mounting surface, the fixing member being fixed on the heat dissipation unit;
    at least one electronic element, each of the electronic element is disposed in a corresponding receiving portion; and
    at least one elastic element, sandwiched between the electronic element and the fixing member, wherein the fixing member and the elastic element press the electronic element to make the electronic element tightly contact the heat dissipation unit.

2. The mounting structure for an electronic element as claimed in claim 1, wherein the fixing member is fixed on the heat dissipation unit via a fixer.

3. The mounting structure for an electronic element as claimed in claim 2, wherein the fixer is a bolt.

4. The mounting structure for an electronic element as claimed in claim 1, wherein the elastic element is an elastic sheet.

5. The mounting structure for an electronic element as claimed in claim 1, wherein the elastic element is a wave spring.

6. The mounting structure for an electronic element as claimed in claim 1, wherein the receiving portion is a recess.

7. The mounting structure for an electronic element as claimed in claim 1, wherein the receiving portion has a plurality of through holes, the electronic element has a plurality of leads, and the leads extend from the receiving portion, pass through the through holes, and protrude on a surface of the fixing member.

8. The mounting structure for an electronic element as claimed in claim 1, wherein the receiving portion comprises a plurality of positioning protrusions, and the positioning protrusions surround the electronic element to limit degree of freedom thereof.

9. The mounting structure for an electronic element as claimed in claim 8, wherein the positioning protrusions are triangular.

* * * * *